United States Patent [19]

Yokoyama

[11] 4,292,468
[45] Sep. 29, 1981

[54] FREQUENCY SELECTION CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 41,322

[22] Filed: May 22, 1979

[30] Foreign Application Priority Data

Jun. 9, 1978 [JP] Japan .................. 53-69515

[51] Int. Cl.³ .................. H03J 5/04; H03G 5/02
[52] U.S. Cl. .................. 179/1 D; 333/28 T; 333/214
[58] Field of Search .......... 179/1 D; 330/107, 109; 333/28 T, 213, 214

[56] References Cited

U.S. PATENT DOCUMENTS

| | | | |
|---|---|---|---|
| 3,643,173 | 2/1972 | Whitten | 330/109 |
| 3,793,593 | 2/1974 | Kennedy et al. | 330/109 |
| 3,835,399 | 9/1974 | Holmes | 330/107 |
| 3,978,420 | 8/1976 | Lane | 330/109 |
| 4,046,960 | 9/1977 | Veale | 330/109 |

Primary Examiner—Bernard Konick
Assistant Examiner—Randall P. Myers
Attorney, Agent, or Firm—Frishauf, Holtz, Goodman and Woodward

[57] ABSTRACT

A frequency selection circuit which is equivalent to an LCR series resonant circuit, though not provided with inductance and which can adjust resonant frequency, selectivity or quality factor Q and circuit impedance at resonance independently of one another, merely by adjusting resistance. The circuit comprises an operational amplifier connected to receive an input signal at its noninverting input, a band rejection filter connected to an output of the operational amplifier, a positive feedback resistor connected between an output of the band rejection filter and the noninverting input of the operational amplifier, and a voltage divider connected between the output of the band rejection filter and the output of the operational amplifier and connected at its output to an inverting input of the operational amplifier. The band rejection filter comprises a series combination of a first resistor and a first capacitor and a parallel combination of a second resistor and a second capacitor. The first and second resistors have the same resistance, and the first and second capacitors have the same capacitance. The resonant frequency of the frequency selection circuit depends solely on the resistance of the first and second resistors and the capacitance of the first and second capacitors in the band rejection filter. The circuit impedance at resonance depends solely on the feedback resistor, and the selectivity solely on a dividing factor of the voltage divider.

10 Claims, 11 Drawing Figures

13 BAND REJECTION FILTER

4,292,468

FREQUENCY SELECTION CIRCUIT

BACKGROUND OF THE INVENTION

This invention relates to a frequency selection circuit, and more particularly to frequency selection circuit which is equivalent to an LCR series resonant circuit, though not provided with inductance.

FIG. 1 shows a typical frequency selection circuit, or a so-called LCR series resonant circuit comprising a resistor 3 of a resistance value R, a capacitor 4 of a capacitance value C and an inductor or coil 5 of an inductance value L—all connected in series between two terminals 1 and 2. The circuit impedance Z between the terminals 1 and 2, resonant frequency $f_0$ and selectivity or quality factor Q are represented as follows:

$$Z = R + j\left(\omega L - \frac{1}{\omega C}\right), \quad (1)$$

$$f_0 = \frac{1}{2\pi\sqrt{LC}}, \quad (2)$$

$$Q = \frac{\omega_0 L}{R} = \frac{1}{R}\sqrt{\frac{L}{C}} \quad (3)$$

In equation (1) $\omega = 2\pi f$, where "f" denotes frequency, and in equation (3) $\omega_0 = 2\pi f_0$. As equations (1), (2) and (3) show, both L and C must be similarly varied in order to change the resonant frequency $f_0$, without changing the quality factor Q. To change Q without changing the resonant frequency $f_0$, it is necessary to vary R or to vary the ratio between L and C, while maintaining the product of L and C constant. In this case, if R is varied, the circuit impedance $Z_0$ (=R) at resonance will change.

To change circuit impedance $Z_0$ at resonance without varying resonant frequency $f_0$ and quality factor Q, it is necessary to vary L, C and R. That is, at least L and C must be adjusted to vary resonant frequency $f_0$, quality factor Q and circuit impedance $Z_0$ at resonance independently of one another. But is extremely difficult to adjust L and C to a desired value. With such a frequency selection circuit as shown in FIG. 1 it is therefore very difficult to adjust resonant frequency $f_0$, quality factor Q and circuit impedance $Z_0$ at resonance, independently of one another.

SUMMARY OF THE INVENTION

It is an object of this invention to provide a frequency selection circuit which is equivalent to an LCR series resonant circuit, though not provided with an inductive component.

Another object of this invention is to provide a frequency selection circuit whose electric characteristics can easily be adjusted.

Still another object of this invention is to provide a frequency selection circuit in which at least one of the electric characteristics, i.e. resonant frequency, selectivity or quality factor Q and circuit impedance at resonance, can easily be adjusted without affecting the remaining electric characteristics.

A frequency selection circuit according to this invention comprises an operational amplifier having its noninverting input connected to receive an input signal, a band rejection filter connected to an output of the operational amplifier, a voltage divider connected between an output of the band rejection filter and the output of the operational amplifier and having its output connected to the inverting input of the operational amplifier, and a feedback resistor connected between the output of the band rejection filter and the noninverting input of the operational amplifier.

The frequency selection circuit is equivalent to an LCR series resonant circuit. Its resonant frequency depends solely on resistors and capacitors in the band rejection filter, its frequency selectivity or quality factor Q solely on a dividing factor of the voltage divider, and its circuit impedance at resonance solely on the feedback resistor.

DESCRIPTION OF THE PREFERRED EMBODIMENTS

Figure 1:
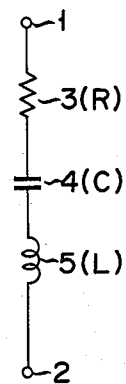
FIG. 1 shows a prior art frequency selection circuit comprising an inductor, a capacitor and a resistor.
Figure 2:
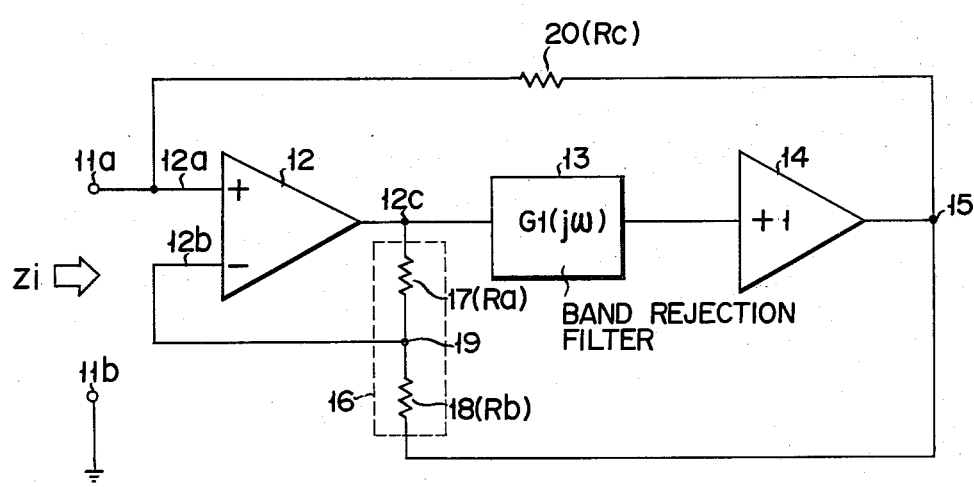
FIG. 2 is a schematic block and circuit diagram of a frequency selection circuit according to one embodiment of this invention.

In FIG. 2 which schematically shows one embodiment of a frequency selection circuit according to this invention, numerals 11a and 11b denote input terminals between which an input signal source (not shown) is connected. The input terminal 11a is connected to a noninverting input 12a of an operational amplifier 12, and the input terminal 11b to the circuit ground. The output 12c of operational amplifier 12 is connected to a band rejection filter 13 which exhibits a desired frequency characteristic. A buffer amplifier 14 (e.g. voltage follower with a gain of unity) is connected between a terminal 15 and the output of band rejection filter 13. Between the terminal 15 and the output 12c of operational amplifier 12 there is connected a voltage divider circuit 16 comprised of a resistor 17 of a resistance value Ra and a resistor 18 of a resistance value Rb. The output of the voltage divider circuit 16 or connection point 19 of the resistors 17 and 18 is connected to an inverting input 12b of the operational amplifier 12. Between the terminal 15 and the noninverting input 12a of the operational amplifier 12 a resistor 20 of a resistance value Rc is connected to provide a positive feedback path led from the output of band rejection filter 13 to the noninverting input 12a of operational amplifier 12.

Figure 3:
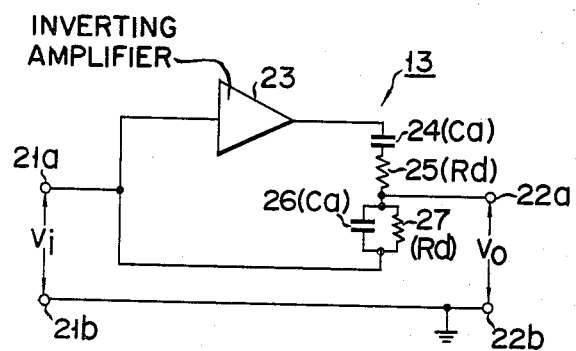
FIG. 3 is a circuit diagram of a band rejection filter used in the frequency selection circuit shown in FIG. 2.

FIG. 3 illustrates an arrangement of the band rejection filter 13. As shown in FIG. 3, between an input terminal 21a and an output terminal 22a there are connected in series an inverting amplifier 23 and a series combination of a capacitor 24 of a capacitance value Ca and a resistor 25 of a resistance value Rd. Further, between the terminals 21a and 22a there is connected a parallel combination of a capacitor 26 and a resistor 27. The capacitor 26 has the same capacitance value as the capacitor 24, and the resistor 27 the same resistance value as the resistor 25. Another input terminal 21b and another output terminal 22b of the band rejection filter 13 are connected to the circuit ground.

The band rejection filter 13 of FIG. 3 has a transfer function $G_1(j\omega)$ which is represented as follows:

$$G_1(j\omega) = \frac{V_0}{V_i} = \frac{1 - j\frac{2+A}{\omega/\omega_0 - \omega_0/\omega}}{1 - j\frac{3}{\omega/\omega_0 - \omega_0/\omega}} \quad (4)$$

where, Vi denotes input voltage, $v_0$ output voltage, and A amplification of inverting amplifier 23.

The band rejection filter has a resonant frequency $f_0$ which is expressed as follows:

$$f_0 = 1/2\pi CaRd \quad (5)$$

If $A = -2$, the transfer function $G_1(j\omega)$ becomes as follows:

$$G_1(j\omega) = \frac{1}{1 - j\frac{3}{\omega/\omega_0 - \omega_0/\omega}} \quad (6)$$

As evident from the equation (6), when $\omega/\omega_0 = 1$ or at resonant frequency, $v_0/v_i = 0$, and at frequencies too far off resonance $v_0/v_i = 1$.

The transfer function $G_T(j\omega)$ of the frequency selection circuit of FIG. 2 is represented as follows:

$$G_{T1} = (Ra + Rb)/(Ra + Rb/G1) \quad (7)$$

Figure 4:
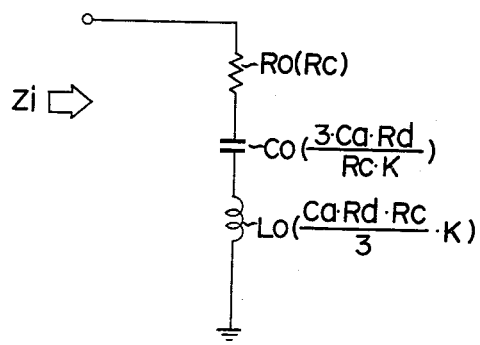
FIG. 4 illustrates an equivalent circuit of the frequency selection circuit shown in FIG. 2.

The input impedance $Z_i$ between the input terminals 11a and 11b is represented as follows:

$$Z_i = Rc + j(Rc/3)[\omega T - (1/\omega T)]K \quad (8)$$

where $T = 1/\omega_0 = Ca \cdot Rd$, and $K = 1 + (Ra/Rb)$. As evident from equation (8), it will be understood that the circuit of FIG. 2 is equivalent to a circuit shown in FIG. 4, which comprises a resistor Ro (= Rc), a capacitor Co (= (3Ca·Rd)/(Rc·K)) and an inductor Lo (= (Ca·Rd·Rc)/3·K). Resonant frequency $f_0$ of the circuit shown in FIG. 2 can therefore expressed as follows:

$$f_0 = 1/(2\pi Ca \cdot Rd) \quad (9)$$

The circuit impedance Zo at resonance and quality factor Q are represented as follows:

$$Zo = Rc \quad (10)$$

$$Q = (\omega_0 \cdot Lo/Rc = \tfrac{1}{3} \cdot K \quad (11)$$

As equations (9), (10) and (11) clearly show, resonant frequency $f_0$ depends solely on the resistors 25 and 27 and capacitors 24 and 26 of the band rejection filter 13, circuit impedance Zo solely on the feedback resistor 20, and circuit Q solely on a resistance ratio between the resistors 17 and 18, i.e. dividing factor of the voltage divider 16. This means that it is possible that the electric characteristics of the frequency selection circuit shown in FIG. 2, i.e. resonant frequency $f_0$, quality factor Q and circuit impedance Zo at resonance can be adjusted independently of one another. The frequency selection circuit of this invention, however, need not be so designed that all its electric characteristic can be adjusted.

Figure 5:
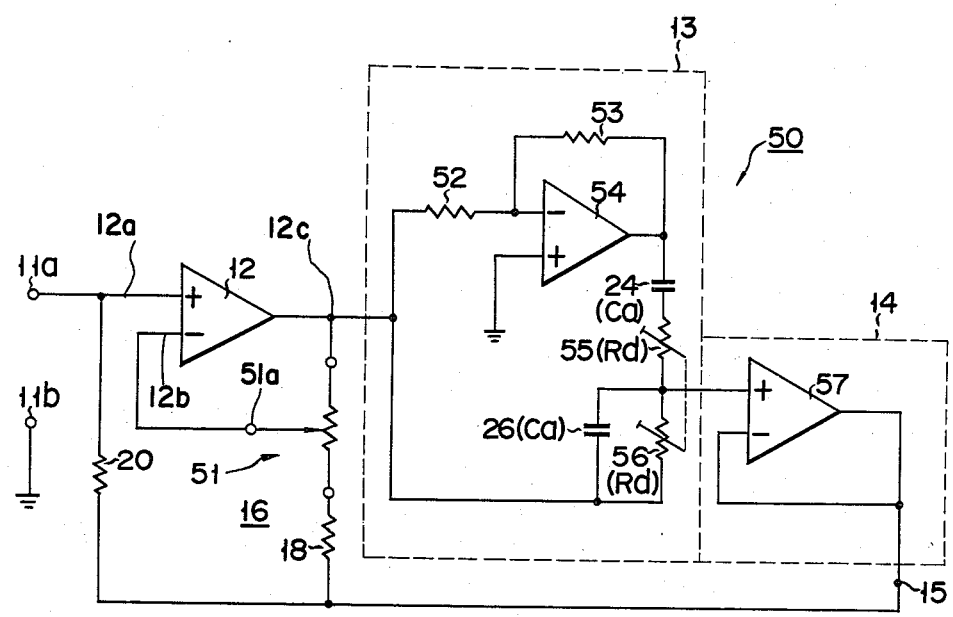
FIG. 5 shows a practical arrangement of the frequency selection circuit shown in FIG. 2.

FIG. 5 illustrates a practical arrangement of the frequency selection circuit shown in FIG. 2. In this arrangement, one of the resistors of the voltage divider 16, for example the resistor 17 of FIG. 2, is constituted by a potentiometer 51, a slider tap 51a of which is connected to the inverting input 12b of the operational amplifier 12. The inverting amplifier 23 (FIG. 3) of the band rejection filter 13 (FIGS. 2 and 3) is constituted by two resistors 52 and 53 and an operational amplifier 54. The resistor 53 has a resistance value two times as large as that of the resistor 52. Further, the resistors 25 and 27 are replaced by ganged trimming or pre-set rheostats 55 and 56, respectively. These rheostats 55 and 56 preset a desired resonant frequency. The buffer amplifier 14 is constituted by an operational amplifier 57. Thus, in the arrangement of FIG. 5, quality factor Q and resonant frequency $f_0$ can be adjusted by potentiometers and rheostats.

Figure 6:
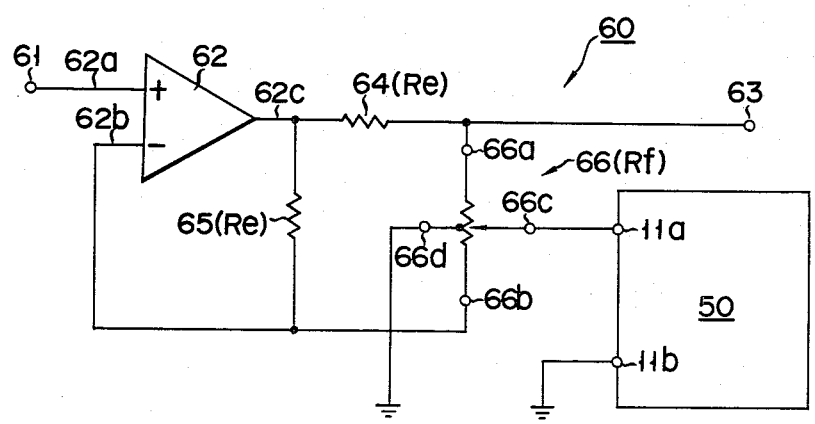
FIG. 6 shows an applied form of the frequency selection circuit according to this invention.

The above-described frequency selection circuit according to this invention may be applied in such a manner as illustrated in FIG. 6. That is, the frequency selection circuit 50 is coupled to an amplifying system 60 as a tone control circuit or a frequency response control circuit. An input terminal 61 of the system 60, which receives an input signal, is connected to a noninverting input 62a of an operational amplifier 62. The output 62c of the operational amplifier 62 is coupled to an output terminal 63 of the amplifying system 60 via a resistor 64 of a resistance value of Re. The output 62c is also coupled to an inverting input 62b of the operational amplifier 62 via a resistor 65 of resistance value Re. Between the output terminal 63 of the amplifying system 60 and the inverting input 62b of the operational amplifier 62 there is connected a center-tapped potentiometer 66 the resistance value of which between fixed terminals 66a and 66b is Rf. The slider 66c of potentiometer 66 is connected to the input terminal 11a of the frequency selection circuit 50, and the center tap 66d to the circuit ground.

Figure 7:
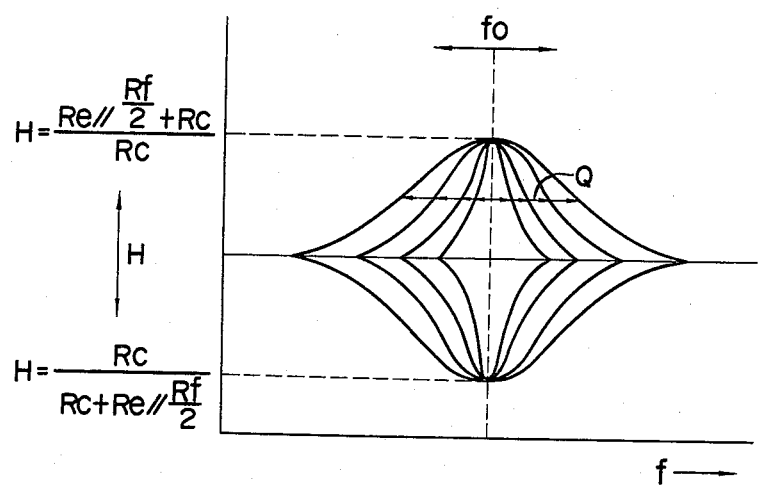
FIG. 7 shows the frequency response characteristic of the circuit shown in FIG. 6.

The amplifying system 60 exhibits such frequency response characteristics as illustrated in FIG. 7. Resonant frequency can be changed by the rheostats 55 and 56 of the band rejection filter 13 of the frequency selection circuit 50. Sharpness Q of frequency response is varied by the potentiometer 51 of the frequency selection circuit 50. The signal level H at the output terminal 63 at frequencies in the vicinity of resonance can be changed by the potentiometer 66. The signal level H rises when the slider 66c of the potentiometer 66 is moved downward in FIG. 6, and it falls when the slider 66c is moved upward.

Figure 8:
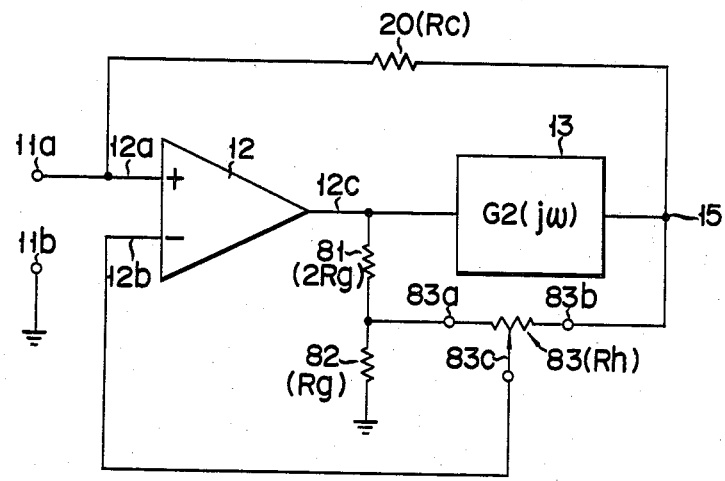
FIG. 8 is a schematic block and circuit diagram of another frequency selection circuit according to this invention.

FIG. 8 shows another frequency selection circuit according to this invention. In this embodiment, between the output 12c of an operational amplifier 12 and the circuit ground a resistor 81 of a resistance value 2Rg and a resistor 82 of a resistance value Rg are connected in series to each other. And between the output 15 and the connecting point of the resistors 81 and 82 there is connected a potentiometer 83 having a resistance value Rh between fixed terminals 83a and 83b. The slider 83c of the potentiometer 83 is coupled to the inverting input 12b of the operational amplifier 12. The potentiometer 83 corresponds to the voltage divider 16 of FIG. 2 which is comprised of the resistors 17 and 18.

Figure 9:
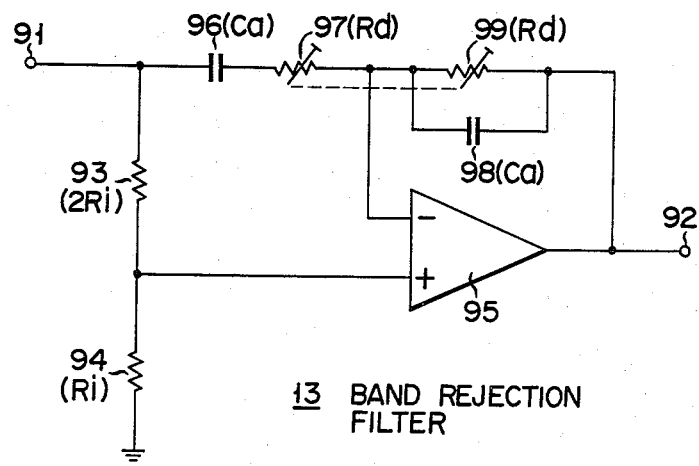
FIG. 9 is a circuit diagram of a band rejection filter used in the circuit shown in FIG. 8.

The band rejection filter 13 of the frequency selection circuit shown in FIG. 8 may be constructed as illustrated in FIG. 9. Between an input terminal 91 and the circuit ground a resistor 93 of a resistance value 2Ri and a resistor 94 of a resistance value Ri are connected in series to each other. Between the input terminal 91 and an output terminal 92 there are connected in series a series combination of a capacitor 96 and a resistor 97 and a parallel combination of a capacitor 98 and a resistor 99. The capacitors 96 and 98 have the same capacitance value Ca, and the resistors 97 and 99 the same resistance value Rd. As shown in FIG. 9, the resistors 97 and 99 may be constituted by ganged trimming or pre-set rheostats. The connection point of the series and parallel combinations and the connection point of the resistors 93 and 94 are coupled respectively to inverting and noninverting inputs of an operational amplifier 95 whose output is connected to the output terminal 92.

The impedance of the series combination of the capacitor 96 and resistor 97 at resonance is twice as large as the impedance of the parallel combination of the capacitor 98 and resistor 99. To make input voltages at the inverting and noninverting inputs of the operational amplifier 95 equal at resonance, the resistor 93 of resistance value 2Ri is connected between the input terminal 91 and the noninverting input of the amplifier 95, and the series combination of the capacitor 96 and resistor 97 is connected between the input terminal 91 and the inverting input of the amplifier 95.

Transfer function $G_2(j\omega)$ and resonant frequency $f_0$ of the band rejection filter shown in FIG. 9 are represented as follows:

$$G_2(j\omega) = \frac{1}{3 - j\frac{6}{(\omega/\omega_0 - \omega_0/\omega)}} \quad (12)$$

$$f_0 = \frac{1}{2\pi Ca \cdot Rd} \quad (13)$$

Transfer function $G_{T2}$ of the frequency selection circuit shown in FIG. 8 is expressed as follows:

$$G_{T2} = \frac{Ra + Rb}{Ra + Rb/3G_2} \quad (14)$$

where, Ra denotes the resistance between the fixed terminal 83a and slider 83c of the potentiometer 83, and Rb the resistance between the fixed terminal 83b and slider 83c of the potentiometer 83. In the circuit of FIG. 8, $Rh = Ra + Rb >> Rg$.

Input terminal $Z_{i2}$ of the circuit shown in FIG. 8 is represented as follows:

$$Z_{i2} = Rc + j(Rc/2 \cdot K \cdot [\omega T - (1/\omega T)] \quad (15)$$

where $K = (Ra + Rb)/Rb$, $T = 1/\omega_0 = Ca \cdot Rd$.

Figure 10:
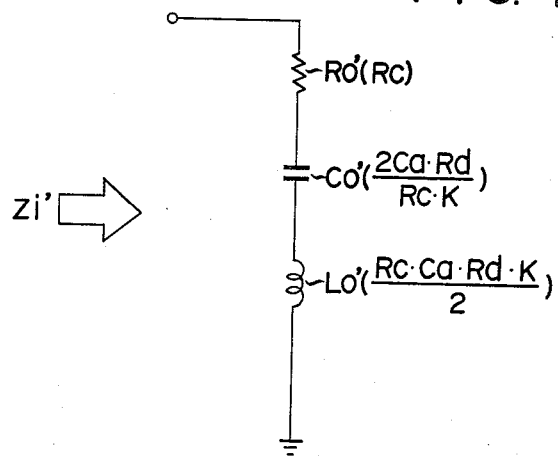
FIG. 10 shows an equivalent circuit of the frequency selection circuit of FIG. 8.

Thus, the circuit of FIG. 8 is considered equivalent to a series resonant circuit shown in FIG. 10 which is constituted by a resistor Ro' (=Rc), a capacitor Co' (=2Ca·Rd/Rc·K) and an inductor Lo' (=Rc·Ca·Rd·K/2).

Figure 11:
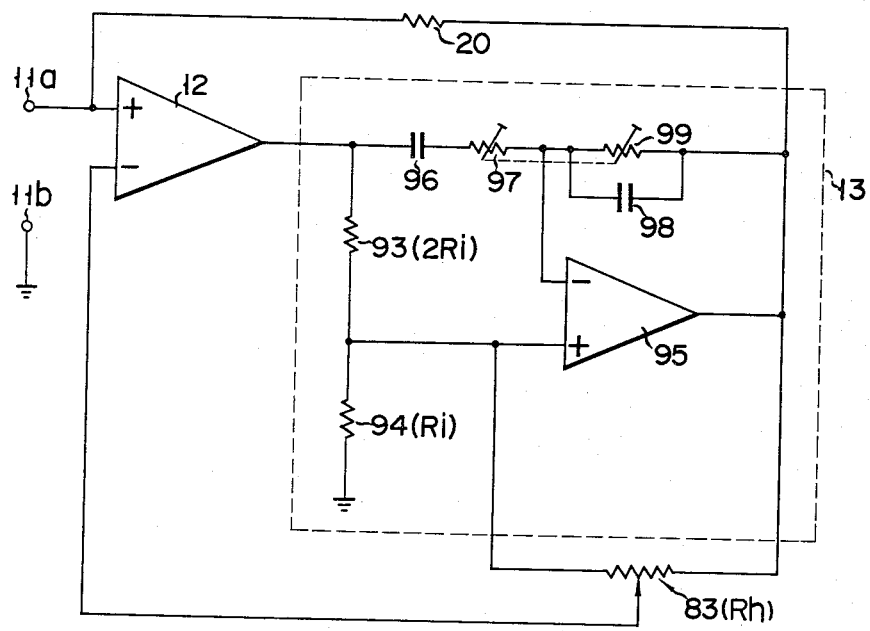
FIG. 11 illustrates a modification of the frequency selection circuit shown in FIG. 8.

The resistance ratio between the resistors 81 and 82 shown in FIG. 8 is equal to the resistance ratio between the resistors 93 and 94 of the band rejection filter shown in FIG. 9. As a result, the frequency selection circuit of FIG. 8 can be modified into such a circuit as shown in FIG. 11. That is, the resistors 81 and 82 may be removed, and the potentiometer 83 may be connected between the output of operational amplifier 95 and the connection point of resistors 93 and 94. In the circuit of FIG. 11, $Rh >> Ri$.

What is claimed is:

1. A frequency selection circuit having a circuit impedance, and resonance frequency, comprising:
   an operational amplifier having an inverting input, a noninverting input and an output, said noninverting input of said operational amplifier being connected to receive an input signal;
   a band rejection filter circuit having an input and an output, the input of said band rejection filter circuit being coupled to said output of said operational amplifier, for controlling the resonance frequency of the frequency selection circuit;
   a voltage divider circuit connected between said output of said operational amplifier and said output of said band rejection filter circuit, and having an output coupled to said inverting input of said operational amplifier for controlling the quality factor of the frequency selection circuit; and
   a feedback resistor coupled between said output of said band rejection filter circuit and said noninverting input of said operational amplifier for determining the circuit impedance of the frequency selection circuit;
   wherein the circuit impedance of the frequency selection circuit depends solely on the feedback resistor, and the quality factor of the frequency selection circuit depends solely on the dividing factor of the voltage divider circuit, and wherein the resonance frequency of the frequency selection circuit is controlled by the band rejection filter circuit independently of said circuit impedance and said quality factor.

2. The circuit according to claim 1 wherein said band rejection filter circuit comprises an inverting amplifier having its input connected to said input of said band rejection filter circuit, a series combination of a first resistor and a first capacitor, and a parallel combination of a second resistor and a second capacitor, said series combination and said parallel combination being connected in series with each other between an output of said inverting amplifier and said input of said band rejection filter circuit and a connection point of said series combination and said parallel combination being connected to said output of said band rejection filter circuit.

3. The circuit according to claim 2 wherein said first and second resistors have substantially the same resistance value and said first and second capacitors have substantially the same capacitance value.

4. The circuit according to claim 2 wherein said series combination is connected between said output of said inverting amplifier and said output of said band rejection filter circuit, said first and second resistors have substantially the same resistance value, said first and second capacitors have substantially the same capacitance value, and said inverting amplifier has a gain of substantially 2.

5. The circuit according to claim 1 wherein said band rejection filter circuit comprises a series combination of a first resistor and a first capacitor, a parallel combination of a second resistor and a second capacitor, said series combination and said parallel combination being connected in series with each other between said input and said output of said band rejection filter circuit, third and fourth resistors connected in series between said input of said band rejection filter circuit and a reference potential circuit point, and a second operational amplifier having first and second inputs connected to a connection point of said series combination and said parallel combination and a connection point of said third and fourth resistors, respectively, and an output connected to said output of said band rejection filter circuit.

6. The circuit according to claim 5 wherein said first and second resistors have substantially the same resistance value, said first and second capacitors have substantially the same capacitance value, and said third and fourth resistors have a resistance ratio of substantially 2:1 so that output voltage of said second operational amplifier becomes the reference potential at a resonant frequency determined by the resistance value of said first and second resistors and the capacitance value of said first and second capacitors.

7. The circuit according to claim 5 wherein said series combination is connected between said input of said band rejection filter circuit and said first input of said second operational amplifier, said third resistor is connected between said input of said band rejection filter circuit and said second input of said second operational amplifier and has a resistance value substantially two times that of said fourth resistor, said first and second resistors have substantially the same resistance value, and said first and second capacitors have substantially the same capacitance value.

8. The circuit according to claim 1 wherein said voltage divider circuit comprises a potentiometer having a slider tap connected to said inverting input of said operational amplifier.

9. The circuit according to any one of claims 2 to 7 wherein said first and second resistors each comprise a rheostat.

10. The circuit according to any one of claims 2 to 7 wherein said first and second resistors each comprise a rheostat, said rheostats being ganged with each other.

* * * * *